US012668882B2

(12) United States Patent
Yamamoto et al.

(10) Patent No.: US 12,668,882 B2
(45) Date of Patent: Jun. 30, 2026

(54) FLUID SUPPLY SYSTEM, PROCESSING APPARATUS, RECORDING MEDIUM, AND METHOD OF MANUFACTURING SEMICONDUCTOR DEVICE

(71) Applicant: Kokusai Electric Corporation, Tokyo (JP)

(72) Inventors: Kaoru Yamamoto, Toyama (JP); Kentaro Goshima, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 553 days.

(21) Appl. No.: 18/176,515

(22) Filed: Mar. 1, 2023

(65) Prior Publication Data

US 2023/0279550 A1    Sep. 7, 2023

(30) Foreign Application Priority Data

Mar. 3, 2022    (JP) ................................. 2022-032401
Jan. 23, 2023    (JP) ................................. 2023-008002

(51) Int. Cl.
*C23C 16/52*        (2006.01)
*C23C 16/448*      (2006.01)
(Continued)

(52) U.S. Cl.
CPC ............ *C23C 16/52* (2013.01); *C23C 16/448* (2013.01); *C23C 16/455* (2013.01);
(Continued)

(58) Field of Classification Search
CPC . C23C 16/52; C23C 16/448; C23C 16/45561; C23C 16/455; H01L 21/0217;
(Continued)

(56) References Cited

U.S. PATENT DOCUMENTS 3,750,687 A * 8/1973 Williams .................. F17D 3/05
                                                    137/154
5,540,251 A * 7/1996 Mayeaux ............. G05D 11/133
                                                    251/210
(Continued)

FOREIGN PATENT DOCUMENTS

JP      2006-283812 A      10/2006
JP      2014-150144 A       8/2014
(Continued)

OTHER PUBLICATIONS

Taiwan Office Action issued on Oct. 6, 2023 for Taiwan Patent Application No. 112104934.
(Continued)

*Primary Examiner* — William M Mccalister
(74) *Attorney, Agent, or Firm* — Volpe Koenig

(57) ABSTRACT

There is provided a technique that includes: a flow rate controller configured to control a flow rate of fluid flowing in a pipe; an adjuster configured to supply an adjustment gas to at least a downstream side of the flow rate controller; and a controller configured to be capable of suppressing a phase change of the fluid, which is caused by a temperature drop due to adiabatic expansion, by supplying the adjustment gas from the adjuster according to a difference between an internal pressure of the flow rate controller and a pressure on the downstream side of the flow rate controller.

18 Claims, 6 Drawing Sheets

(51) Int. Cl.
| | |
|---|---|
| *C23C 16/455* | (2006.01) |
| *G05D 7/06* | (2006.01) |
| *H10P 14/60* | (2026.01) |
| *H10P 14/694* | (2026.01) |

(52) U.S. Cl.
CPC ..... *C23C 16/45561* (2013.01); *G05D 7/0635* (2013.01); *H10P 14/6682* (2026.01); *H10P 14/69433* (2026.01)

(58) Field of Classification Search
CPC ......... H01L 21/02211; Y10T 137/2931; Y10T 137/87676; Y10T 137/87692; Y10T 137/87684; G05D 7/0635
USPC .................................. 137/154, 605, 606, 607
See application file for complete search history.

(56) References Cited

U.S. PATENT DOCUMENTS

| | | | | |
|---|---|---|---|---|
| 5,878,771 | A * | 3/1999 | Mayeaux | G05D 11/133 251/210 |
| 6,390,115 | B1 * | 5/2002 | Rohwer | B01F 25/433 137/3 |
| 6,752,387 | B1 | 6/2004 | Nishizato et al. | |
| 7,332,040 | B1 * | 2/2008 | Kojima | F16K 31/06 118/726 |
| 2009/0061541 | A1 * | 3/2009 | Moriya | G05D 7/0658 257/E21.219 |
| 2011/0100483 | A1 | 5/2011 | Nagata et al. | |
| 2012/0305188 | A1 * | 12/2012 | Kato | C23C 16/45525 137/10 |
| 2014/0209022 | A1 | 7/2014 | Inoue et al. | |
| 2014/0227886 | A1 * | 8/2014 | Sano | C23C 16/45531 438/762 |
| 2014/0273507 | A1 * | 9/2014 | Hirose | H01L 21/02274 438/758 |
| 2014/0287597 | A1 * | 9/2014 | Hirose | H01L 21/0228 438/786 |
| 2015/0093911 | A1 * | 4/2015 | Nakatani | H01L 21/02123 438/761 |
| 2015/0187559 | A1 * | 7/2015 | Sano | C23C 16/45527 438/763 |
| 2015/0228474 | A1 * | 8/2015 | Hanashima | C23C 16/38 118/704 |
| 2015/0332916 | A1 * | 11/2015 | Noda | H01J 37/32449 118/715 |
| 2017/0232457 | A1 * | 8/2017 | Fujino | C23C 16/45578 118/724 |
| 2018/0012735 | A1 | 1/2018 | Sawachi et al. | |
| 2018/0204742 | A1 * | 7/2018 | Tateno | H01L 21/67248 |
| 2018/0350638 | A1 | 12/2018 | Kaga et al. | |
| 2019/0093222 | A1 * | 3/2019 | Okuda | H01L 21/67313 |
| 2019/0390333 | A1 | 12/2019 | Nishida et al. | |
| 2020/0087785 | A1 * | 3/2020 | Hirochi | H01L 21/68742 |
| 2020/0411330 | A1 * | 12/2020 | Yoshida | C23C 16/34 |
| 2021/0082685 | A1 * | 3/2021 | Kataoka | H01L 21/02312 |
| 2021/0249256 | A1 * | 8/2021 | Ashihara | C23C 16/402 |
| 2021/0324282 | A1 | 10/2021 | Foody et al. | |
| 2022/0170160 | A1 * | 6/2022 | Hirano | H01L 21/683 |
| 2022/0267688 | A1 | 8/2022 | Foody et al. | |
| 2022/0267905 | A1 * | 8/2022 | Seino | C23C 16/52 |

FOREIGN PATENT DOCUMENTS

| | | |
|---|---|---|
| JP | 2018-014479 A | 1/2018 |
| JP | 2019-178430 A | 10/2019 |
| JP | 2020-004957 A | 1/2020 |
| KR | 10-0386217 B1 | 6/2003 |
| KR | 10-2010-0118583 A | 11/2010 |
| WO | 2021/003564 A1 | 1/2021 |

OTHER PUBLICATIONS

Extended European Search Report issued on May 23, 2023 for European Patent Application No. 23159392.2.
Korean Office Action issued on May 16, 2025 for Korean Patent Application No. 10-2023-0027726.

\* cited by examiner

Figure 6:
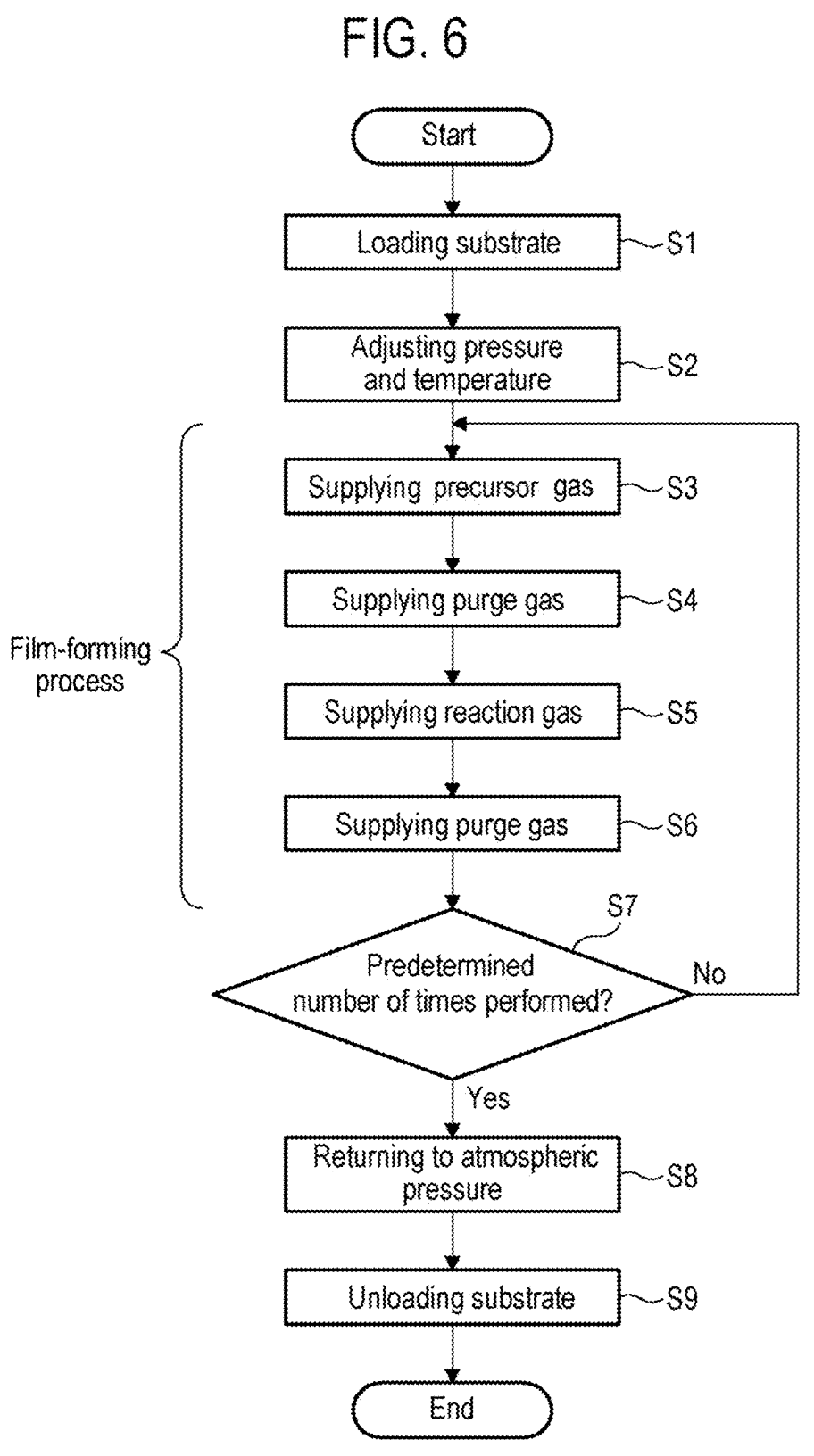

Start

↓

Loading substrate — S1

↓

Adjusting pressure and temperature — S2

↓

Supplying precursor gas — S3

↓

Supplying purge gas — S4

Film-forming process {

↓

Supplying reaction gas — S5

↓

Supplying purge gas — S6

↓

Predetermined number of times performed? — S7    No

Yes

↓

Returning to atmospheric pressure — S8

↓

Unloading substrate — S9

↓

End

1

FLUID SUPPLY SYSTEM, PROCESSING APPARATUS, RECORDING MEDIUM, AND METHOD OF MANUFACTURING SEMICONDUCTOR DEVICE

CROSS-REFERENCE TO RELATED APPLICATIONS

This application is based upon and claims the benefit of priority from Japanese Patent Application Nos. 2022-032401 and 2023-008002, filed on Mar. 3, 2022 and Jan. 23, 2023, respectively, the entire contents of which are incorporated herein by references.

TECHNICAL FIELD

The present disclosure relates to a fluid supply system, a substrate processing apparatus, a recording medium, and a method of manufacturing a semiconductor device.

BACKGROUND

In the related art, a semiconductor manufacturing apparatus for manufacturing a semiconductor device is known as an example of a substrate processing apparatus. For example, substrate processing in which a substrate (hereinafter also referred to as a "wafer") is processed under a predetermined processing condition by supplying a processing gas into a reaction tube is performed. Generally, a mass flow controller (MFC) as a flow rate controller is used to supply a processing gas. Hereinafter, the mass flow controller may simply be referred to as an MFC.

In recent years, various processing gases, such as gases obtained by vaporizing liquids and gases obtained by sublimating solids, have been used. It is known that when these processing gases are controlled by an MFC, adiabatic expansion occurs at a subsequent stage of the MFC.

When the processing gas re-solidifies (or re-liquefies) due to a temperature drop by this adiabatic expansion and reaches an interior of a reaction tube in a solid (or liquid) state (fine powder or mist state), particles may be generated.

SUMMARY

Some embodiments of the present disclosure provide a technique for supplying a processing gas without being phase-changed.

According to one embodiment of the present disclosure, there is provided a technique that includes: a flow rate controller configured to control a flow rate of fluid flowing in a pipe; an adjuster configured to supply an adjustment gas to at least a downstream side of the flow rate controller; and a controller configured to be capable of suppressing a phase change of the fluid, which is caused by a temperature drop due to adiabatic expansion, by supplying the adjustment gas from the adjuster according to a difference between an internal pressure of the flow rate controller and a pressure on the downstream side of the flow rate controller.

BRIEF DESCRIPTION OF DRAWINGS

The accompanying drawings, which are incorporated in and constitute a part of the specification, illustrate embodiments of the present disclosure.

2

Figure 1:
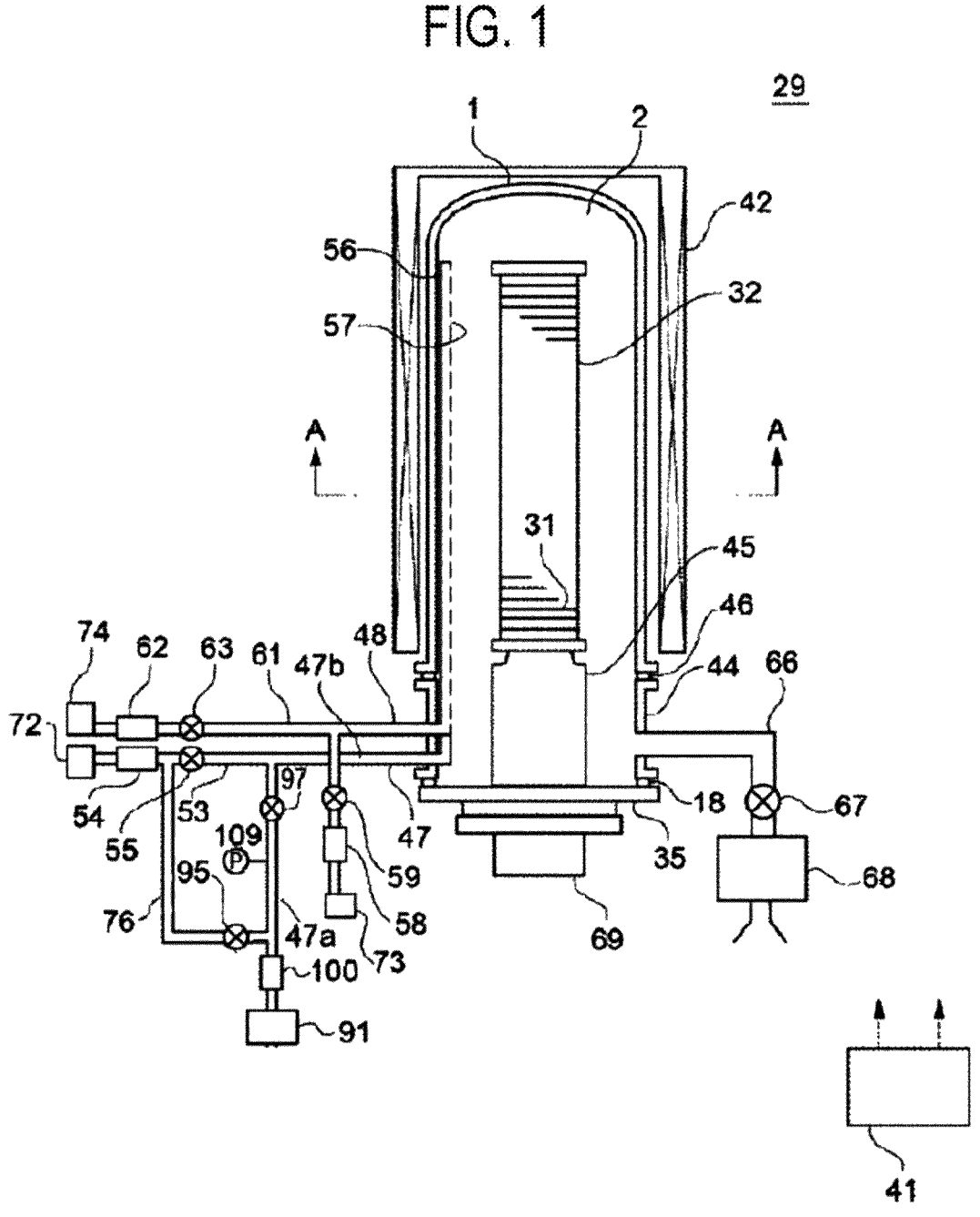
FIG. 1 is a longitudinal sectional view showing a schematic configuration of a process furnace of a substrate processing apparatus according to embodiments of the present disclosure.
Figures 2, 3:
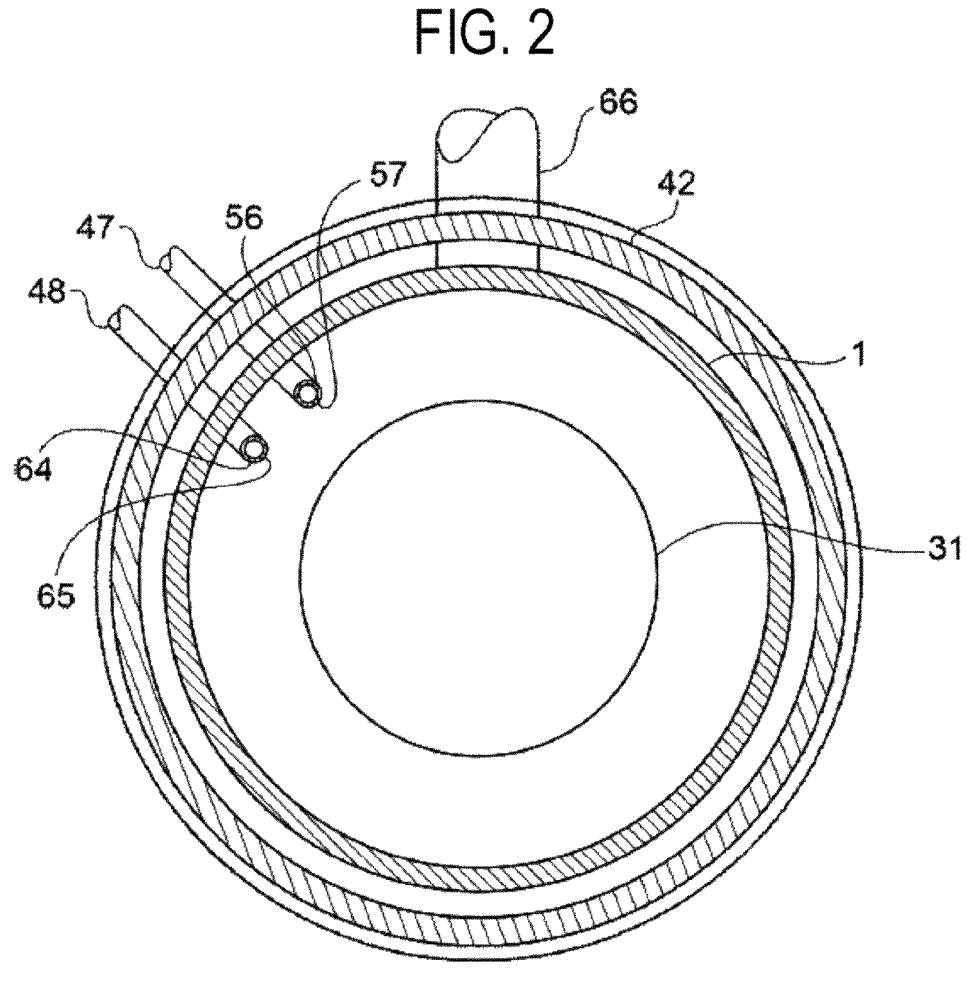

FIG. 2 is a schematic cross-sectional view taken along line A-A in FIG. 1.

FIG. 3 shows a schematic diagram showing a fluid supply system of a substrate processing apparatus according to embodiments of the present disclosure.

Figure 4:
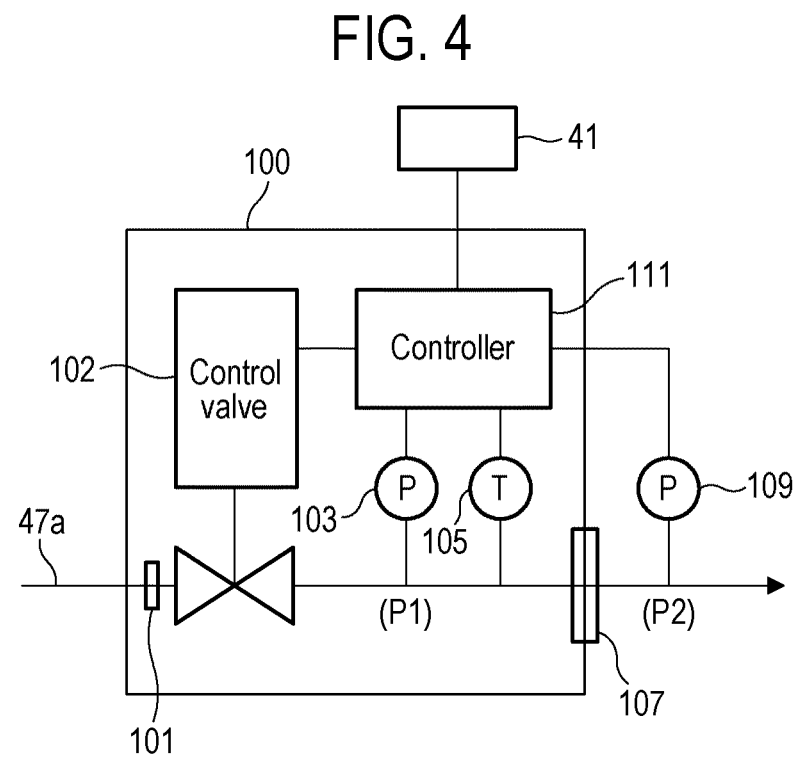

FIG. 4 is a diagram showing an example of a schematic configuration of a flow rate controller according to embodiments of the present disclosure.

Figure 5:
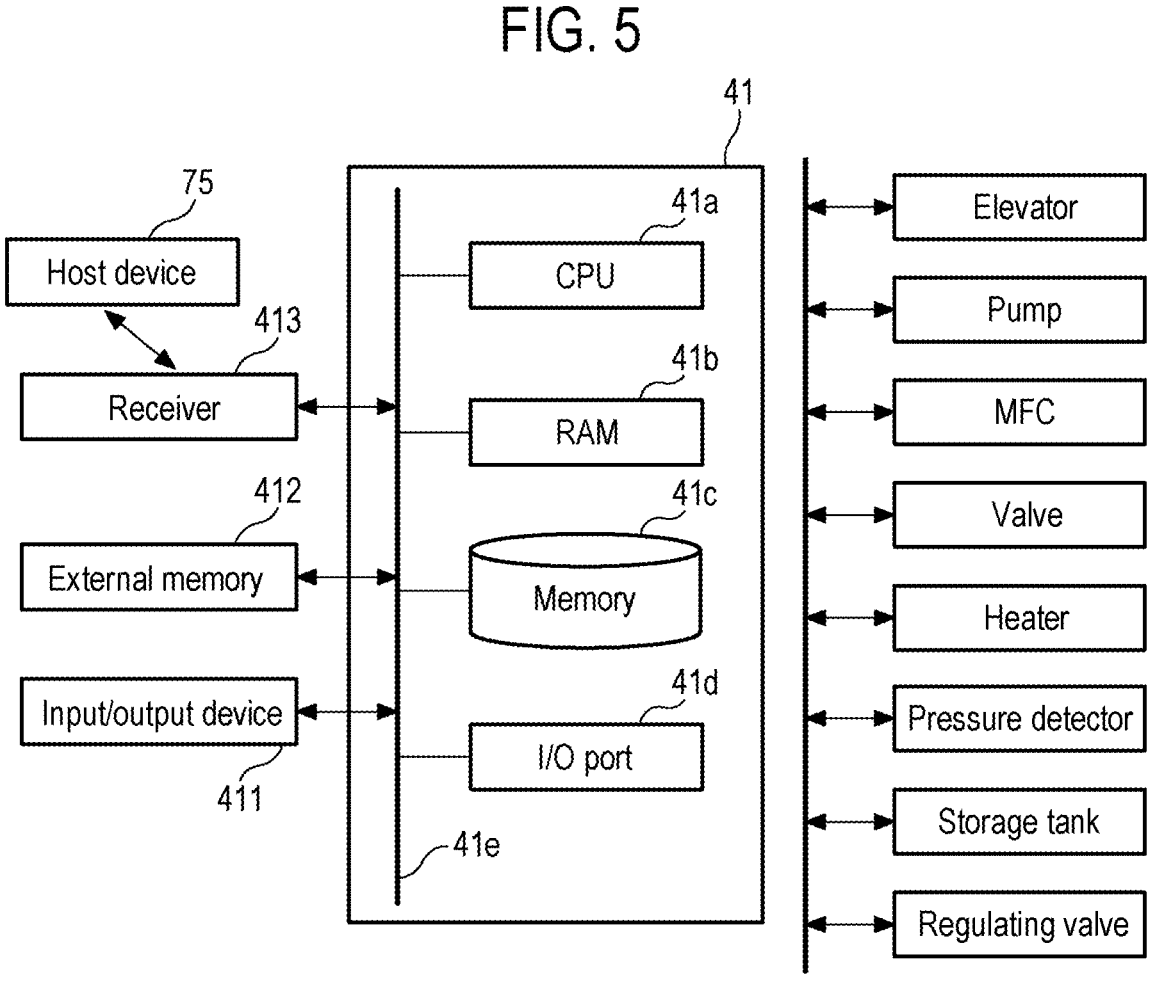

FIG. 5 is a schematic configuration diagram of a controller of a substrate processing apparatus according to embodiments of the present disclosure, in which a control system of the controller is shown in a block diagram.

FIG. 6 is a flowchart of a substrate processing process according to embodiments of the present disclosure.

Figure 7:
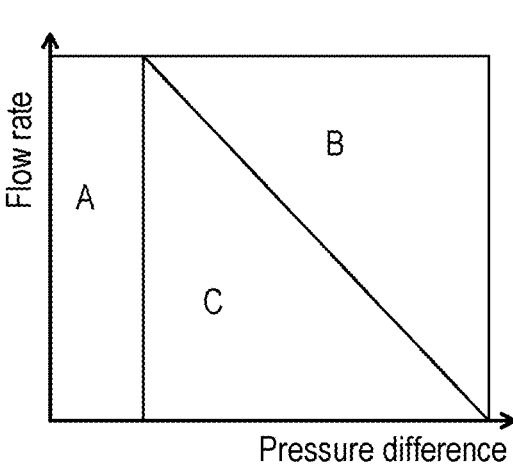

FIG. 7 is a diagram showing characteristics of a flow rate controller according to embodiments of the present disclosure.

Figure 8:
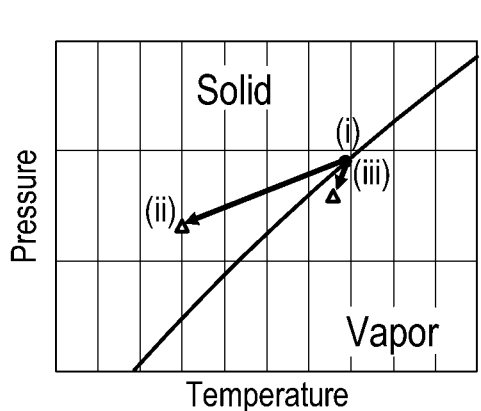

FIG. 8 is a diagram showing a vapor pressure curve of a solid precursor and state transition of a precursor gas in embodiments of the present disclosure.

Figure 9:
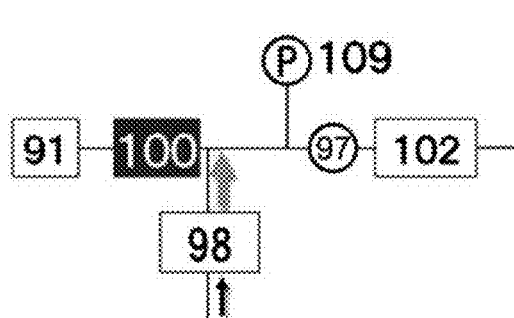

FIG. 9 is a schematic diagram showing a fluid supply system of a substrate processing apparatus in embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Structure of Substrate Processing Apparatus>

FIGS. 1 and 2 show a vertical process furnace 29 used in a substrate processing apparatus which is an example of a processing apparatus. First, the outline of the operation of the substrate processing apparatus to which the present disclosure is applied will be described with reference to FIG. 1. The drawings used in the following description are all schematic, and the dimensional relationship, ratios, and the like of various elements shown in figures do not always match the actual ones. Further, the dimensional relationship, ratios, and the like of various elements between plural figures do not always match each other.

When a predetermined number of substrates 31 as objects to be processed are transferred and charged into a boat 32 as a holder, the boat 32 is moved up by a boat elevator and is loaded into the process furnace 29. In a state where the boat 32 is completely loaded, the process furnace 29 is air-tightly closed by a seal cap 35. In the air-tightly closed process furnace 29, according to a selected process recipe, a substrate 31 is processed by supplying a processing gas into the process furnace 29, and discharging an atmosphere of a process chamber 2 by an exhaust device (not shown) through a gas exhaust pipe 66. Here, the processing gas includes, for example, a precursor gas, a reaction gas, a mixture of these gases and a carrier gas, and the like. In the present disclosure, all gases that contribute to the processing of the substrate 31 as above are referred to as a processing gas. Further, all gases supplied to the process furnace 29, which include the processing gas and an inert gas as a gas that does not contribute to the processing of the substrate 31, may simply be referred to as a fluid.

Next, the process furnace 29 will be described with reference to FIGS. 1 and 2. A reaction tube 1 is installed inside a heater 42 which is a heating device (heating means), a manifold 44 made of, for example, stainless steel or the like is consecutively connected to the lower end of the reaction tube 1 via an O-ring 46 which is an airtight member, and a lower end opening (furnace opening) of the manifold 44 is air-tightly closed by the seal cap 35, which is a cover, via an O-ring 18, which is an airtight member. The process chamber 2 is defined and formed by at least the reaction tube 1, the manifold 44, and the seal cap 35.

The boat 32 is erected on the seal cap 35 via a boat support table 45, and the boat support table 45 serves as a holder for holding the boat 32.

Two gas supply pipes (a first gas supply pipe 47 and a second gas supply pipe 48) as supply paths for supplying a plurality of kinds of processing gases (here, two kinds of processing gases) are installed in the process chamber 2.

On the first gas supply pipe 47, a precursor source 91, a first mass flow controller (hereinafter also referred to as an MFC) 100 which is a flow rate controller (flow rate control device), a pressure sensor 109, and a valve 97 (hereinafter sometimes referred to as an opening/closing part) as a first opening/closing valve, are installed sequentially from the upstream. Further, a supply valve (not shown) is installed in a pipe at the upstream side of the pressure sensor 109 and the downstream side of the first MFC 100.

A first carrier gas supply pipe 53 for supplying an inert gas joins on the downstream side of the opening/closing valve 97. On the first carrier gas supply pipe 53, a carrier gas source 72, an MFC 54 as a flow rate control device (flow rate control means), and a valve 55 as an opening/closing valve, are installed sequentially from the upstream. Further, at the leading end portion of the first gas supply pipe 47, a first nozzle 56 is installed to extend from a lower portion to a top portion along an inner wall of the reaction tube 1. Gas supply holes 57 for supplying a gas are formed on the side surface of the first nozzle 56. The first gas supply holes 57 are formed from a lower portion to an upper portion at equal pitches and have the same opening area. A regulator (automatic pressure control valve) may be installed instead of the MFC 54.

In the present embodiment, a carrier gas (for example, a N$_2$ gas), which is an inert gas, supplied from the carrier gas source 72, is used as an adjustment gas to adjust the pressure of the pressure sensor 109. Details thereof will be described later. In addition, the adjustment gas (carrier gas) is supplied by a pipe 76 as an adjustment gas supply pipe to a supply pipe 47a between the first MFC 100 and the opening/closing valve 97 via a valve 95. In the present embodiment, a structure for supplying the adjustment gas to the supply pipe 47a between the first MFC 100 and the opening/closing valve 97 via the valve 95 may be referred to an adjuster (hereinafter also referred to as a flow rate adjuster). That is, the adjuster is configured to include at least the carrier gas source 72, the MFC 54, the pipe 76 for supplying the inert gas as the adjustment gas to the supply pipe 47a (hereinafter also referred to as an adjustment gas supply pipe), and the valve 95. In the present embodiments, although the carrier gas source 72 and the MFC 54 are configured to be integrated with a supply system that supplies an inert gas into the reaction tube 1, it is not particularly limited to this form and the carrier gas source and the MFC may be individually installed as the adjuster.

Here, the first gas supply pipe 47, the precursor source 91, the first MFC 100, the pressure sensor 109, and the opening/closing valve 97 are collectively referred to a first gas supplier (first gas supply line). Further, the first nozzle 56 may be included in the first gas supplier. Further, the first carrier gas supply pipe 53, the carrier gas source 72, the MFC 54, and the valve 55 may be included in the first gas supply part.

(Precursor Source)

A precursor (liquid precursor, solid precursor, which is received from the precursor source 91, is generated as a precursor gas (fluid of a gaseous state) in the precursor source 91. This precursor gas joins with the first carrier gas supply pipe 53 via the first MFC 100 and the opening/closing valve 97 and is also supplied into the process chamber 2 via the first nozzle 56. In the present embodiment, when a solid precursor is supplied into the process chamber 2, the precursor source 91 is configured as a precursor tank 91. That is, a processing gas obtained by sublimating the solid precursor in the precursor tank 91 is supplied into the process chamber 2. Specifically, the solid precursor is placed in the precursor tank 91, and the precursor tank 91 is heated by a sub-heater as a heating means (not shown), the heated solid precursor is sublimated, and a gaseous precursor gas is supplied into the process chamber 2. When a liquid precursor is supplied into the process chamber 2, the precursor source 91 is configured as a vaporizer. That is, the vaporizer 91 is heated by a sub-heater, and a precursor gas of a vaporized state (a gaseous state) in the vaporizer 91 is supplied into the process chamber 2. A gas in which a carrier gas or an inert gas as an adjustment gas is mixed with a precursor gas is also included in the processing gas. In addition, the specific descriptions is omitted, the precursor source 91 also includes a precursor gas source that is gaseous at the room temperature.

(Precursor Tank)

The precursor tank 91 is configured to heat and sublimate a solid precursor to generate a precursor gas as a processing gas.

(Vaporizer)

The vaporizer 91 is configured to heat and vaporize a precursor supplied in a liquid form to generate a precursor gas as a processing gas.

The precursor source 91 can also include a sub-heater (not shown). By the heating of the sub-heater, it is configured to be capable of being controlled to be equal to or higher than a temperature at which the precursor is transformed into a gaseous state. Further, the precursor source 91 includes a heating part for heating each of the supply pipe 47a between the first MFC 100 and the opening/closing valve 97, a supply pipe 47b between the opening/closing valve 97 and the first nozzle 56, the first MFC 100, the opening/closing part 97. In addition, it is desirable to control the temperature to be equal to or higher than the vaporization temperature of the above-mentioned precursor which is the source of a fluid.

In the second gas supply pipe 48, a reaction gas source 73, a third MFC 58, which is a flow rate controller, and a valve 59, which is an opening/closing valve, are installed sequentially from the upstream direction, and a second carrier gas supply pipe 61 for supplying a carrier gas joins on the downstream side of the valve 59. In the second carrier gas supply pipe 61, a carrier gas source 74, a fourth MFC 62, which is a flow rate controller, and a valve 63, which is an opening/closing valve, are installed sequentially from the upstream. A second nozzle 64 is installed at the leading end portion of the second gas supply pipe 48 in parallel with the first nozzle 56, and second gas supply holes 65, which are supply holes for supplying a gas, are formed on the side surface of the second nozzle 64. The second gas supply holes 65 are vertically formed at equal pitches and have the same opening area.

Here, the second gas supply pipe 48, the third MFC 58, the valve 59, and the second nozzle 64 are collectively referred to as a second gas supplier (second gas supply line). The second carrier gas supply pipe 61, the fourth MFC 62, and the valve 63 may be included in the second gas supplier. Further, the reaction gas source 73 and the carrier gas source 74 may be included in the second gas supplier. A reaction gas supplied from the reaction gas source 73 joins with the second carrier gas supply pipe 61 via the third MFC 58 and the valve 59 and is supplied into the process chamber 2 via the second nozzle 64. Needless to say, the reaction gas is included in the processing gas.

The process chamber 2 is connected to a vacuum pump 68, which is an exhaust device (exhausting means), via the gas exhaust pipe 66 for exhausting a gas, and is vacuum-exhausted. A valve 67 as a pressure regulating valve is a second opening/closing valve that can be opened/closed to perform and stop the vacuum exhaust of the process chamber 2 and can adjust a pressure by adjusting the valve opening degree.

A boat rotator 69 is installed in the seal cap 35 and rotates the boat 32 to improve process uniformity.

Next, the fluid supply system to be managed according to the present embodiment will be specifically described with reference to FIGS. 3 to 5. FIG. 3 is an enlarged view of a main part of the supply pipe 47a for supplying the precursor gas. Herein, when the constitutions are the same as those of FIG. 1, the indication thereof may be omitted.

As shown in FIG. 3, the first gas supply line includes, as main parts, at least the MFC 100 that controls a flow rate of fluid such as a processing gas flowing through the supply pipe 47a, the pressure gauge 109 as a pressure sensor that detects a pressure inside the supply pipe 47a on a secondary side (output side) of the MFC 100, the MFC 54 that supplies an inert gas as an adjustment gas to the downstream side of the supply pipe 47a from at least the MFC 100 at a controlled flow rate, and the opening/closing part 97 configured to be capable of supplying the fluid into the process chamber 2. The MFC 54, the MFC 100, the pressure gauge 109, and the opening/closing part 97 are electrically connected to a controller 41.

(Control Part)

The controller 41 corresponds to a "control part" of the present disclosure and is configured to be capable of supplying an adjustment gas via the MFC 54 according to a difference between an internal pressure of the MFC 100 and a pressure on the secondary side of the MFC 100. Details thereof will be described later. The configuration of the controller 41 will be described later.

(Opening/Closing Part)

A Cv value of the opening/closing valve 97 (hereinafter also referred to as a valve characteristic value) is generally set to fall within a range of 0.05 or more and 0.7 or less. Here, the valve characteristic value (Cv value), which is defined in JIS B 0100:2013, is a capacity coefficient indicating the ease of flow peculiar to the valve and is a value representing a capacity when a fluid flows through the valve at a certain differential pressure across the valve. In the present embodiment, it is set to a predetermined value in a range of 0.4 to 0.7. According to such a valve characteristic value, with the opening/closing valve 97 shown in FIG. 3 kept open, by supplying the adjustment gas (inert gas) whose flow rate is adjusted by the MFC 54, a pressure on the secondary side (output side) of the first MFC 100, that is, a pressure P2 on the downstream side of the first MFC 100, can be increased. In order to supply a large flow rate of precursor gas from the first MFC 100, it is desirable that the valve characteristic value is large and the optimal valve characteristic value is 0.7. However, regardless of the flow rate of the adjustment gas, it is possible to supply a desired precursor gas if the valve characteristic value is 0.4 or more.

Here, if the valve characteristic value is less than 0.4, the pressure will fluctuate too much with respect to the flow rate of the adjustment gas (inert gas), which makes pressure control impossible, and as a result, the flow rate control will become unstable. Further, if the valve characteristic value is larger than 0.7, a large amount of the adjustment gas (inert gas) is required in order to suppress re-solidification due to a temperature drop due to adiabatic expansion, and as a result, it may be difficult to control the internal pressure of the process furnace 29. Further, there is a possibility that the adjustment of gas distribution in the intra-plane of the substrate 31 and the inter-plane of the substrate 31 will be disturbed (become non-uniform), which may deteriorate the quality of the substrate processing. When the valve characteristic value is 0.4 or more and 0.7 or less, by supplying an appropriate adjustment gas (inert gas), it is possible to control the internal pressure of the process furnace 29 while stably suppressing the adiabatic expansion and obtain a desired gas distribution within the intra-plane of the substrate 31 and the inter-plane of the substrate 31 while suppressing the generation of particles.

(First MFC)

As shown in FIG. 4, the first MFC 100 includes a pre-filter 101, a control valve 102, a first pressure sensor 103, a temperature sensor 105, an orifice 107, a second pressure sensor 109, and a controller 111. Although not shown in FIG. 4, the first MFC 100 is provided with a supply valve (not shown) that opens/closes the flow path of the supply pipe 47a, at a subsequent stage of the control valve 102. The opening/closing valve (opening/closing part) 97 is provided in the supply pipe 47a on the downstream of the first MFC 100.

The internal pressure sensor 103, the temperature sensor 105, and the second pressure sensor 109 are connected to the controller 111. The opening/closing valve 97 is also connected to the controller 111. The controller 111 is also connected to the controller 41 (see FIG. 5) which will be described later. The controller 111 controls a flow rate of a precursor gas as a fluid flowing through a downstream side at a predetermined value. The controller 111 and the controller 41 may be implemented integrally instead of separately. In other words, the configuration may be such that control for supplying the above-mentioned adjustment gas is performed.

The first MFC 100 of the present embodiment is of a pressure control type that utilizes a choke flow in the orifice, and is controlled to maintain a pressure value that satisfies a choke flow condition in the orifice in the first MFC 100. Specifically, when a supply pressure of the precursor gas from the precursor source 91 on the upstream side of the orifice is P1 and a pressure on the downstream side of the orifice is P2, the pressure P2 is maintained at a pressure value that satisfies the choke flow conditional expression "$P1 \geq 2P2$" in the orifice. Further, it is configured to be capable of controlling the flow rate of the precursor gas to be kept constant with respect to the pressure fluctuation of the precursor source 91.

FIG. 7 shows a conceptual diagram of characteristics of the first MFC 100. As shown in FIG. 7, a region A is a region where control is impossible due to an insufficient pressure difference (pressure P2−pressure P1), a region B is a region where control is possible, and a region C is a region where control is possible but there is a risk of particle occurrence.

With the recent miniaturization of semiconductor devices, the structure of the surface of the substrate 31 has become more complicated, while requirements for in-plane film thickness uniformity of a single substrate 31 and film thickness uniformity between substrates 31 have become stricter. In order to meet these requirements, precursor gas must be supplied into the process chamber 2 at a large flow rate as a need to supply the gas evenly to an increased surface area of the substrate 31 increases.

Here, as shown in FIG. 7, when it is attempted to output a large flow rate of precursor gas from the MFC 100, a possibility of generating particles increases (region C). This is because adiabatic expansion occurs in the subsequent stage of the MFC 100, so that a temperature drop occurs. As a result, the gaseous precursor gas is phase-changed to be transformed into the original solid (or liquid), so that fine powder (or mist) is generated. Especially, when the pressure difference (pressure P2−pressure P1) is large, this fine powder (or mist) rides on the choke flow together with the precursor gas, reaches the process chamber 2, and becomes a factor of particles. Therefore, the pressure difference (pressure P2−pressure P1) must be reduced (region B). Here, when a large flow rate of precursor gas is output from the MFC 100, it is necessary to make an adjustment so as not to exceed the control limit value of the MFC (region A). Although this control limit value depends on the MFC, it is generally between 20 Torr and 100 Torr.

Next, the controller 41, which is a control part (control means), will be described. As shown in FIG. 5, the controller 41 is configured as a computer including a central processing unit (CPU) 41a, a random access memory (RAM) 41b, a memory 41c, and an I/O port 41d. The RAM 41b, the memory 41c, and the I/O port 41d are configured to be capable of exchanging data with the CPU 41a via an internal bus 41e. An input/output device 411, which is formed of, e.g., a touch panel or the like, and an external memory 412 may be connected to the controller 41. Further, there is installed a receiver 413 which is connected to a host device 75 via a network. The receiver 413 can receive information on other devices from the host device 75.

The memory 41c is configured by, for example, a flash memory, a hard disk drive (HDD), or the like. A control program for controlling operations of a substrate processing apparatus, a process recipe, a correction recipe, etc. in which sequences and conditions of substrate processing to be described later are written, are readably stored in the memory 41c. The process recipe and the correction recipe function as programs for causing the controller 41 to execute each sequence in a substrate processing process and a characteristic checking process performed in a substrate processing mode, to obtain an expected result. When the term "program" is used herein, it may indicate a case of including the process recipe and the correction recipe only, a case of including the control program only, or a case of including all the process recipe, the correction recipe, and the control program. The RAM 41b is configured as a memory area (work area) in which a program or data read by the CPU 41a is temporarily stored. In the present embodiment, the memory 41c stores characteristic data including the control limit range of the flow rate controller (especially the MFC 100) shown in FIG. 7, and characteristic data including the vapor pressure curves for precursors such as various solid precursors and liquid precursors shown in FIG.

8. Further, threshold values (for example, the pressure difference (P1−P2) and the valve characteristic value), which are set in advance, are stored in the memory 41c. Further, the I/O port 41d is connected to an elevating member, a heater, a mass flow controller, each MFC, each valve, and the like.

The controller 41, which is the control part, performs the flow rate adjustment of the MFCs installed in the substrate processing apparatus, the opening/closing operation of the valves, the temperature adjustment of the heater, the actuating and stopping operation of the vacuum pump, the rotation speed adjustment of the boat rotator, the elevating operation control of the boat elevator, and so on. Further, in the present embodiment, the controller 41 acquires characteristic data shown in FIGS. 7 and 8, which are stored in the memory 41c, and threshold values of a pressure difference (P1−P2) that is set in advance and a valve characteristic value, and controls the operations of the MFC 54, the MFC 100, the pressure gauge 109, the valve 95, etc. based on these characteristic data and threshold values.

Then, the controller 41 causes the carrier gas source 72 to supply the adjustment gas whose flow rate is adjusted by the MFC 54 to the supply pipe 47a on the downstream side of the first MFC 100, and adjusts a pressure difference between the internal pressure P1 of the first MFC 100 and the pressure P2 on the downstream side of the first MFC 100 based on the threshold value of the pressure difference (P1−P2) so as not to exceed the control limit value of the first MFC 100. Therefore, since a precursor gas flowing through the supply pipe 47a from the precursor source 91 can be set to the conditions of (iii) of FIG. 8, the phase change of the precursor gas can be suppressed.

The controller 41 is not limited to being configured as a dedicated computer, and may be configured as a general-purpose computer. For example, the controller 41 of the present embodiment can be configured by preparing the external memory (for example, a semiconductor memory such as a USB memory or a memory card) 412 that stores the aforementioned program and installing the program on the general-purpose computer by using the external memory 412. A means for supplying the program to the computer is not limited to a case of supplying the program via the external memory 412. For example, the program may be installed on the computer using communication means such as the Internet or a dedicated line, instead of using the external memory 412. The memory 41c or the external memory 412 is configured as a non-transitory computer-readable recording medium. Hereinafter, the memory 41c and the external memory 412 may be generally and simply referred to as a "recording medium." When the term "recording medium" is used herein, it may indicate a case of including the memory 41c only, a case of including the external memory 412 only, or a case of including both the memory 41c and the external memory 412.

<Method of Processing Substrate>

Next, an example of processing a substrate will be described. Here, as an example of a process of manufacturing a semiconductor device, a cycle process in which a source gas (precursor gas) and a reactant gas (reaction gas) are alternately supplied into the process chamber will be described. In the present embodiment, an example of forming a film on a substrate will be described.

In the process of the present embodiment, a film is formed on a substrate 31 by performing a cycle a predetermined number of times (one or more times), the cycle including non-simultaneously performing a step of supplying a precursor gas to the substrate 31 in the process chamber 2 (film-formation step 1: step S3 in FIG. 6), a purge step of removing the precursor gas (residual gas) from the process chamber 2 (film-forming step 2: step S4 in FIG. 6), a step of supplying a nitrogen-containing gas to the substrate 31 in the process chamber 2 (film-forming step 3: step S5 in FIG. 6), and a purge step of removing the nitrogen-containing gas (residual gas) from the process chamber 2 (film-forming step 4: step S6 in FIG. 6).

First, as described above, the substrate 31 is charged into the boat 32 and loaded into the process chamber 2 (step S1 in FIG. 6). At this time, after the boat 32 is loaded into the process chamber 2, the internal pressure and internal temperature of the process chamber 2 are adjusted (step S2 in FIG. 6). Next, four steps of film-forming steps 1 to 4 are sequentially executed. Each step will be described in detail below.

(Film-Forming Step 1)

In film-forming step 1, first, a precursor gas is adsorbed on the surface of the substrate 31. Specifically, in the first gas supply line, with the opening/closing valve 97 opened, the precursor gas generated in the precursor source 91 is supplied into the process chamber 2 by the first MFC 100.

Here, in the present embodiment, when the pressure difference (P1–P2) falls within a preset range (that is, the state of region B), the controller 41 causes the precursor gas generated in the precursor source 91 to be supplied into the process chamber 2 by the first MFC 100 without supplying an adjustment gas to the supply pipe 47a.

On the other hand, when the pressure difference (P1–P2) is out of the preset range (that is, the state of region C), the controller 41 causes an adjustment gas whose flow rate is controlled by the MFC 54 to be supplied to the supply pipe 47a in order to operate the first MFC 100 in the state of region B shown in FIG. 7. Then, when the pressure difference (P1–P2) falls within the preset range, the controller 41 stops the supply of the adjustment gas and causes a mixture of the precursor gas generated in the precursor source 91 and the adjustment gas to be supplied into the process chamber 2 by the first MFC 100. In addition, it may be possible to supply a small amount of the adjustment gas which does not affect the film formation without stopping the supply of the adjustment gas.

Further, a threshold value as a first predetermined value may be determined within a preset range (a controllable range of the first MFC 100). In this case, the controller 41 can determine the flow rate supply time of the adjustment gas as a time required until the difference between the internal pressure of the first MFC 100 and the pressure on the secondary side of the first MFC 100 becomes equal to or less than the preset first predetermined value. As a result, the first MFC 100 in the region C can be changed to the state of region B. Then, the mixture of the precursor gas generated in the precursor source 91 and the adjustment gas is supplied into the process chamber 2 by the first MFC 100. For example, the first predetermined value is set to a lower limit pressure that prevents a phase change due to adiabatic expansion. Further, a value with a slight margin from the lower limit pressure may be used.

The above-described control for transitioning the first MFC 100 from the state of region C to the state of region B is performed by sequentially executing the four steps of film-forming steps 1 to 4 and must be completed until the next film-forming step 1 proceeds. According to the present embodiment, it is possible to supply a constant flow rate controlled by the MFC 54, so that it is easy to complete the control in advance until the next film-forming step 1 proceeds.

10

(Film-Forming Step 2)

In film-forming step 2, the opening/closing valve 97 of the first gas supply pipe 47 and the valve 55 of the first carrier gas supply pipe 53 are closed to stop the supply of the precursor gas and the carrier gas. With the valve 67 of the gas exhaust pipe 66 kept open, the process furnace 29 is exhausted to 20 Pa or less by the vacuum pump 68 to remove the residual precursor gas from the process chamber 2. At this time, when an inert gas such as a $N_2$ gas used as a carrier gas is supplied to the process furnace 29, the effect of removing the residual precursor gas is further enhanced.

(Film-Forming Step 3)

In film-forming step 3, a nitrogen-containing gas and a carrier gas are allowed to flow. First, the valve 59 installed in the second gas supply pipe 48 and the valve 63 installed in the second carrier gas supply pipe 61 are both opened, the nitrogen-containing gas whose flow rate is adjusted by the third MFC 58 from the second gas supply pipe 48 is mixed with the carrier gas whose flow rate is adjusted by the fourth MFC 62 from the second carrier gas supply pipe 61, and a mixture of the nitrogen-containing gas and the carrier gas is supplied into the process chamber 2 from the second gas supply holes 65 of the second nozzle 64 and exhausted from the gas exhaust pipe 66. By supplying the nitrogen-containing gas, a film on abase film of the substrate 31 reacts with the nitrogen-containing gas and a nitride film on the substrate 31 is formed.

(Film-Forming Step 4)

After the nitride film is formed, in film-forming step 4, the valves 59 and 63 are closed, the process chamber 2 is vacuum-exhausted by the vacuum pump 68 as the exhaust device to remove the nitrogen-containing gas remaining after contributing to the film formation. At this time, when an inert gas such as a $N_2$ gas used as a carrier gas is supplied into the process chamber 2, the effect of removing the residual nitrogen-containing gas from the process chamber 2 is enhanced.

Then, with the above-described film-forming steps 1 to 4 as one cycle, a film having a predetermined film thickness can be formed on the substrate 31 by performing the cycle of film-forming steps 1 to 4 a predetermined number of times in step S7 in FIG. 6. In the present embodiment, film-forming steps 1 to 4 are repeated a plurality of times.

After the above-described film-forming process is completed, in step S8 in FIG. 6, the pressure of the process chamber 2 is returned to the normal pressure (atmospheric pressure). Specifically, for example, an inert gas such as a $N_2$ gas is supplied into the process chamber 2 and is exhausted. As a result, the process chamber 2 is purged with the inert gas to remove a gas and the like remaining in the process chamber 2 from the process chamber 2 (inert gas purge). Thereafter, the atmosphere of the process chamber 2 is substituted with the inert gas (inert gas substitution), and the pressure of the process chamber 2 is returned to the normal pressure (atmospheric pressure). Then, in step S9 in FIG. 6, when the substrate 31 is unloaded from the process chamber 2, the substrate processing according to the present embodiment is completed.

EXAMPLES

FIG. 8 shows a vapor pressure curve of a solid precursor as an example of the precursor and a state transition of a fluid (in this case, a precursor gas obtained by sublimating a solid precursor). The present embodiment will be described in detail with reference to FIG. 8.

In FIG. 8, (i) shows a state of the precursor gas when it is supplied from the precursor source 91 to the first MFC 100. In this state, if only sublimation is required, the sub-heater can be used to raise the temperature, but the higher the temperature, the higher the risk of solidification and corrosion. Therefore, the temperature is controlled so as not to be set to an excessively high temperature and to be close to the sublimation temperature (near the vapor pressure curve).

In FIG. 8, (ii) shows a result when the first MFC 100 outputs the precursor gas under the condition of region C shown in FIG. 7. In FIG. 8, in the present embodiment, when a large flow rate of precursor gas is output from the first MFC 100, (iii) shows a result when the pressure difference (P1-P2) is adjusted with an adjustment gas so as not to exceed the control limit value of the first MFC (so as not to enter the region A shown in FIG. 7). That is, this is the result when the first MFC 100 outputs the precursor gas under the condition of region B shown in FIG. 7 and the pressure difference (P1-P2) is adjusted to be near the control limit value of the first MFC.

Here, when comparing (ii) and (iii) in FIG. 8, the state transition in (iii) in FIG. 8 is much smaller than that of (ii) in FIG. 8. In other words, it can be seen that the state transition due to the adiabatic expansion when the precursor gas is discharged from the first MFC 100 is reduced. This is because the adjustment gas is supplied to the downstream side (secondary side) of the first MFC 100 to increase the pressure P2 on the downstream side (secondary side) of the first MFC 100 before supplying the precursor gas into the process chamber 2, thereby reducing the value of the pressure difference (P1-P2) to reduce an effect by the adiabatic expansion.

In this way, according to the present embodiment, the controller 41 can detect in advance a condition in which a phase change (Vapor→Solid) of the gaseous precursor gas ((i) in FIG. 8) is generated by a temperature drop due to the adiabatic expansion when a large flow rate is discharged from the MFC 100, and can adjust the pressure difference (P1-P2) such that the phase change (Vapor→Solid) is not generated even if the temperature drops due to the adiabatic expansion. For example, the threshold value (first set value) may be set to a value near the lower limit pressure that prevents the phase change due to the adiabatic expansion, and the controller 41 may compare the pressure difference (P1-P2) with the threshold value.

Since the present embodiment has the configuration including the first MFC 100 that controls the flow rate of precursor gas flowing through the supply pipe 47a, the pressure gauge 109 that detects the pressure on the secondary side of the first MFC 100, the supplier that supplies the adjustment gas (inert gas) to at least the secondary side (downstream side) of the first MFC 100, and the controller 41 configured to be capable of suppressing the phase change of the precursor gas by causing the adjustment gas to be supplied from the adjuster according to the difference between the internal pressure P1 of the first MFC 100 and the pressure P2 on the secondary side (downstream side) of the first MFC 100, it is possible to supply a large flow rate of precursor gas into the process chamber 2. Therefore, it is possible to improve the step coverage and reproducibility of a film formed on the surface of the substrate 31, thereby enhancing the in-plane film thickness uniformity of the substrate and the film thickness uniformity between substrates.

Further, in the present embodiment, by supplying the adjustment gas from the adjuster according to the difference between the internal pressure P1 of the first MFC 100 and the pressure P2 on the secondary side (downstream side) of the first MFC 100, the effect of adiabatic expansion due to the discharge of a large flow rate of precursor gas from the first MFC 100 can be suppressed, so that it is possible to suppress the re-solidification (or re-liquefaction) of the precursor gas. In particular, since the controller 41 can minimize the pressure difference (P1-P2) so as not to exceed the control limit value of the first MFC 100, it possible to continuously supply a large flow rate of gas into the process chamber 2.

Further, flush supply can also be achieved by increasing the capacity of the precursor source 91 or increasing the diameter of the orifice 107 of the flow path. Further, in the present embodiment, it is possible to dispose a container that stores the processing gas between the MFC 100 and the opening/closing valve 97, whereby the first nozzle 56 can discharge the precursor gas into a decompressed process chamber 2. Therefore, it is possible to perform flash supply for improving the in-plane film thickness uniformity of the substrate and the film thickness uniformity between substrates.

(Modification)

FIG. 9 shows a modification of FIG. 3. A difference from FIG. 3 is that a heater 98 for heating an inert gas (carrier gas) as an adjustment gas is further installed. The other configuration is the same as the fluid supply system shown in FIG. 3. For the same components as those of FIG. 3, the indication thereof are omitted in FIG. 9. Thus, herein, the configuration relating to the heater 98 will be described.

As shown in FIG. 9, it is configured to include the heater 98 for heating the inert gas (carrier gas), as the adjustment gas, to a temperature equal to or higher than a sublimation temperature or a vaporization temperature of the fluid to be supplied into the process chamber 2. It is configured such that the fluid supplied to the process chamber 2 is heated by being mixed with the adjustment gas heated by the heater 98. With this configuration, it is possible to directly contact the adjustment gas with respect to the fluid, so that the temperature of the fluid can be increased more efficiently than installing a heater or the like as a heating means on the outside of the pipe.

For example, since the state in FIG. 8 can be shifted to the right, it is possible to make the solid state in FIG. 8 a vapor state. Specifically, the fluid supplied to the process chamber 2 is heated by heat conduction with the adjustment gas heated by the heater 98, so that a temperature increasing effect by heating of the fluid is expected in addition to suppressing a temperature decrease by the adiabatic expansion by the adjustment gas. Thereby, it becomes possible to suppress re-solidification (or re-liquefaction) of the fluid (particularly the precursor gas).

Particularly, the above effect by the adjustment gas is exerted by being mixed with the fluid supplied into the processing chamber 2 in the pipe on the downstream side, which is directly connected to the flow rate controller such as the first MFC. Therefore, in the configuration shown in FIG. 9, the effects of suppressing the temperature decrease due to adiabatic expansion by the adjustment gas and increasing the temperature by heating the fluid are most expected.

Other Embodiments

Although the embodiments of the present disclosure have been specifically described above, the present disclosure is not limited to the above-described embodiments, and various modifications can be made without departing from the gist of the present disclosure.

For example, in the present embodiment, the pipe 76 and the valve 95 are installed as components of the flow rate adjuster, but the present disclosure is not limited thereto. Although not shown, the opening/closing valve 97 may be installed in the pipe 47b, that is, between the MFC 54 and the nozzle 56 (desirably in the vicinity of the nozzle 56). In this case, since the inert gas can be supplied as the adjustment gas to the downstream side of the first MFC 100 by the inert gas source 72 and the MFC 54, the pipe 76 and the valve 95 in the present embodiment can be omitted. On the other hand, separately (independently) from the inert gas source 72 and the MFC 54, the inert gas source, the MFC, the valves, the pipes, etc. as an adjustment gas supplier may be directly connected to the downstream side of the first MFC 100.

Further, a pressure gauge may be installed in the supply pipe 47a on the upstream side of the first MFC 100 to measure the supply pressure P1 of the precursor gas from the precursor source 91. In this case, the controller 41 causes the adjustment gas whose flow rate is controlled by the MFC 54 to be supplied to the supply pipe 47a in order to operate the first MFC 100 in the state of region B shown in FIG. 7. Then, when the pressure difference (P1–P2) is within a preset range (or is a preset threshold value (first predetermined value)), the controller 41 stops the supply of the adjustment gas, and causes the mixture of the precursor gas and the adjustment gas to be supplied into the process chamber 2 with the control valve 102 kept open. As a result, since adjustment can be made to the condition of region B of the first MFC 100 so as not to exceed the control limit value of the MFC, it is possible to supply a large flow rate of precursor gas into the process chamber 2. As a result, since the precursor gas can be spread over the surface of the substrate 31, it is possible to improve the in-plane film thickness uniformity of the single substrate 31 and the film thickness uniformity between substrates 31.

Further, although the first MFC 100 is of a pressure control type using the choke flow in the orifice, it may be a heat control type MFC. The heat control type is a method of controlling a flow rate in response to a change in temperature of two temperature detectors installed in a flow path. Specifically, the heat control type is to separate the gas flow path into a bypass line and a sensor line, detect the change in temperature from two temperature sensors installed in the upstream and downstream sides of the sensor line, and control a flow rate Q based on the detected change. Herein, the total flow rate Q is sensor flow Q1+bypass flow Q2. When a temperature of the upstream-side temperature sensor is T1, a temperature of the downstream-side temperature sensor is T2, and a division ratio k is Q2/Q1, the flow rate Q is expressed as Q=kx(T1–T2).

Even when this heat control-type MFC is adopted, the controller 41 can check whether or not the pressure difference (P1–P2) is within the preset range. If it is out of the range, the controller 41 can cause the adjustment gas to be supplied to the supply pipe 47a in order to operate the heat control-type MFC in the state of region B shown in FIG. 7. That is, the heat control-type MFC is applicable to the present disclosure.

Regardless of the valve characteristic value of the opening/closing valve 97, the pressure P2 on the downstream side of the MFC 100 can be increased by closing the opening/closing valve 97. Specifically, when the pressure difference (P1–P2) is out of the preset range (that is, in the state of region C) and even if the conductance value of the opening/ closing valve 97 is not in a range of 0.05 to 0.7, by closing the opening/closing valve 97, the controller 41 causes the adjustment gas whose flow rate is controlled by the MFC 54 to be supplied into the supply pipe 47a, to increase the downstream side pressure P2 of the first MFC 100. However, if the valve characteristic value is high, a large amount of inert gas is required. If the valve characteristic value is too low, the precursor gas flow rate becomes small, which may lead to a possibility that a desired precursor gas flow rate cannot be supplied into the process chamber 2. In particular, it is difficult to apply it when the supply time of the precursor gas is short in a cyclic process or the like.

Further, for example, in the above-described embodiments, as the film-forming process performed by the substrate processing apparatus, the solid precursor as the precursor gas is used and it is configured such that the precursor gas is generated by heating and sublimating the solid precursor. Although the case in which the nitride film is formed on the substrate 31 by using the nitrogen-containing gas as the reactant (reactive gas) and supplying these gases alternately, is taken as an example, the present disclosure is not limited thereto.

Herein, as the solid precursor, there is a solid precursor chemical substance, particularly inorganic solid precursor metal or a semiconductor precursor, and for example, $HfCl_4$, $ZrCl_4$, $AlCl_3$, $MoO_2Cl_2$, or $MoCl_5$ or $SiI_4$ is adopted as the solid precursor.

Further, it is configured to heat and vaporize a precursor supplied in a liquid form to generate a precursor gas. Examples of the liquid precursor may include chlorosilane-based gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane gas ($Si_2Cl_6$, abbreviation: HCDS) gas, and an octachlorotrisilane ($Si_3Cl_8$, abbreviation: OCTS) gas. Examples of the precursor gas may include fluorosilane-based gases such as a tetrafluorosilane ($SiF_4$) gas and a difluorosilane ($SiH_2F_2$) gas, bromosilane-based gases such as a tetrabromosilane ($SiBr_4$) gas and a dibromosilane ($SiH_2Br_2$) gas, and iodosilane-based gases such as a tetraiodosilane ($SiI_4$) gas and a diiodosilane ($SiH_2I_2$) gas. Examples of the precursor gas may also include aminosilane-based gases such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, and a bis(tert-butylamino)silane ($SiH_2[NH(C_4H_9)]_2$, abbreviation: BTBAS) gas. Further, as the precursor gas, for example, an organic-based silane precursor gas such as a tetraethoxysilane ($Si(OC_2H_5)_4$, abbreviation: TEOS) gas can also be used. One or more of these gases can be used as the precursor gas. That is, the precursor gas can also include precursors that are stored in a liquid form by pressurization or cooling.

As the nitrogen-containing gas, one or more selected from the group of a nitrous oxide ($N_2O$) gas, a nitric oxide (NO) gas, a nitrogen dioxide ($NO_2$) gas, an ammonia ($NH_3$) gas, and the like can be used.

Further, the reactant is not limited to the nitrogen-containing gas, and other types of thin films may be formed using gases that react with the source to perform film processing. Furthermore, the film-forming process may be performed using three or more kinds of processing gases.

Further, for example, in each of the above-described embodiments, the film-forming process in the semiconductor device is taken as an example of the process performed by the substrate processing apparatus, but the present disclosure is not limited thereto. The technique of the present disclosure can be applied to all processes performed by exposing an object on which a pattern with a high aspect ratio (that is, the depth is greater than the width) is formed to a vaporized gas. That is, in addition to the film-forming process, the process performed by the substrate processing apparatus may be a process of forming an oxide film or a nitride film, or a process of forming a film containing metal. Further, the specific contents of the substrate processing is irrelevant, and the present disclosure can be suitably applied not only to the film-forming process but also to other substrate processing such as annealing, oxidation, nitridation, diffusion, lithography, and the like.

Further, the present disclosure can also be suitably applied to other substrate processing apparatuses such as an annealing apparatus, an oxidation apparatus, a nitridation apparatus, an exposure apparatus, a coating apparatus, a drying apparatus, a heating apparatus, a plasma processing apparatus, and the like. Further, the present disclosure may be suitably applied to a mixture of these apparatuses.

Further, in the present embodiments, although the semiconductor manufacturing process has been described, the present disclosure is not limited thereto. For example, the present disclosure can also be applied to substrate processing such as a liquid crystal device manufacturing process, a solar cell manufacturing process, a light emitting device manufacturing process, a glass substrate processing process, a ceramic substrate processing process, and a conductive substrate processing process.

Further, a portion of the configuration of any embodiment can be replaced with the configuration of another embodiment, and the configuration of another embodiment can be added to the configuration of any embodiment. Further, it is also possible to add, delete, or replace a portion of the configuration of each embodiment with another configuration.

Further, in the above-described embodiments, an example of using the $N_2$ gas as the inert gas has been described, but the present disclosure is not limited thereto. For example, a rare gas such as an Ar gas, a He gas, a Ne gas, and a Xe gas may be used as the inert gas. However, in this case, it is necessary to prepare a rare gas source. Further, it is necessary to connect this rare gas source to the first gas supply pipe 47 so that the rare gas can be introduced.

According to the present disclosure in some embodiments, it is possible to supply a processing gas without being phase-changed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A fluid supply system comprising:
a flow rate controller configured to control a flow rate of fluid flowing in a pipe;
an adjuster configured to supply an adjustment gas to at least a downstream side of the flow rate controller; and
a controller configured to be capable of suppressing a phase change of the fluid, which is caused by a temperature drop due to adiabatic expansion, by supplying the adjustment gas from the adjuster according to a difference between an internal pressure of the flow rate controller and a pressure on the downstream side of the flow rate controller,
wherein the controller is further configured to:
compare the difference between the internal pressure of the flow rate controller and the pressure on the downstream side of the flow rate controller with a first predetermined value which is set in advance;
cause the adjustment gas to be supplied to a pipe on the downstream side of the flow rate controller when the difference is larger than the first predetermined value; and
cause the flow rate controller to supply the fluid into a process chamber when the difference is equal to or less than the first predetermined value.

2. The fluid supply system claim 1, wherein a supply time of the adjustment gas is a time required until the difference between the internal pressure of the flow rate controller and the pressure on the downstream side of the flow rate controller becomes equal to or less than the first predetermined value.

3. The fluid supply system of claim 1, wherein the controller is configured to be capable of adjusting the difference between the internal pressure of the flow rate controller and the pressure on the downstream side of the flow rate controller to fall within a controllable pressure range of the flow rate controller.

4. The fluid supply system of claim 1, further comprising: an opening/closing part configured to be capable of supplying the fluid into a process chamber,
wherein a valve characteristic value of the opening/closing part is set to 0.4 or more and 0.7 or less.

5. The fluid supply system of claim 1, wherein the controller is further configured to include a memory which stores characteristic data including a vapor pressure curve of a precursor that is a source of the fluid.

6. The fluid supply system of claim 1, wherein the controller is further configured to include a memory which stores characteristic data including a control limit range of the flow rate controller.

7. The fluid supply system claim 1, wherein the first predetermined value is a lower limit pressure which prevents the phase change of the fluid.

8. The fluid supply system of claim 1, wherein the controller is configured such that a pressure in a pipe directly connected to an output side of the flow rate controller is lower than a control limit value at which a controllable state of the flow rate controller is maintained.

9. The fluid supply system of claim 8, wherein the controller is configured such that a pressure in the pipe directly connected to the output side of the flow rate controller is higher than a pressure lower limit which prevents the phase change of the fluid.

10. The fluid supply system of claim 1, further comprising: a precursor source configured to generate the fluid,
wherein the precursor source is any one of a precursor tank configured to generate a precursor gas by subliminating a solid precursor and a vaporizer configured to generate a precursor gas by vaporizing a liquid precursor.

11. The fluid supply system of claim 10, wherein the precursor source includes a sub-heater configured to heat the precursor tank or the vaporizer, and is configured to be capable of being controlled to a temperature higher than a temperature at which the precursor gas is transformed into a gaseous state by heating the sub-heater.

12. The fluid supply system of claim 4, further comprising: a heater configured to heat the pipe, the flow rate controller, a pressure sensor, and the opening/closing part,
  wherein a temperature of the heater is controlled to a temperature equal to or higher than a vaporization temperature of a precursor that is a source of the fluid.

13. The fluid supply system of claim 10, further comprising: a container configured to store the fluid between the flow rate controller and an opening/closing valve,
  wherein the controller is configured to temporarily store the fluid, which is generated in the precursor source, in the container and flush-supply the fluid into a process chamber.

14. The fluid supply system of claim 1, further comprising a heater configured to heat the adjustment gas to a temperature equal to or higher than a sublimation temperature or a vaporization temperature of the fluid,
  wherein the fluid is heated by being mixed with the adjustment gas.

15. The fluid supply system of claim 1, wherein the adjuster is installed to be directly connected to a downstream of the flow rate controller.

16. A processing apparatus comprising:
  a flow rate controller configured to control a flow rate of fluid flowing in a pipe;
  an adjuster configured to supply an adjustment gas to at least a downstream side of the flow rate controller; and
  a controller configured to be capable of suppressing a phase change of the fluid, which is caused by a temperature drop due to adiabatic expansion, by supplying the adjustment gas from the adjuster according to a difference between an internal pressure of the flow rate controller and a pressure on the downstream side of the flow rate controller,
  wherein the controller is further configured to:
    compare the difference between the internal pressure of the flow rate controller and the pressure on the downstream side of the flow rate controller with a first predetermined value which is set in advance;
    cause the adjustment gas to be supplied to a pipe on the downstream side of the flow rate controller when the difference is larger than the first predetermined value; and
    cause the flow rate controller to supply the fluid into a process chamber when the difference is equal to or less than the first predetermined value.

18

17. A non-transitory computer-readable recording medium storing a program that is executed in a processing apparatus including a flow rate controller configured to control a flow rate of fluid flowing in a pipe, an adjuster configured to supply an adjustment gas to at least a downstream side of the flow rate controller, and a controller, and causes the controller to be capable of performing a process comprising:
  suppressing a phase change of the fluid, which is caused by a temperature drop due to adiabatic expansion, by supplying the adjustment gas from the adjuster according to a difference between an internal pressure of the flow rate controller and a pressure on the downstream side of the flow rate controller;
  comparing the difference between the internal pressure of the flow rate controller and the pressure on the downstream side of the flow rate controller with a first predetermined value which is set in advance;
  causing the adjustment gas to be supplied to a pipe on the downstream side of the flow rate controller when the difference is larger than the first predetermined value; and
  causing the flow rate controller to supply the fluid into a process chamber when the difference is equal to or less than the first predetermined value.

18. A method of manufacturing a semiconductor device executed by using the fluid supply system of claim 1, comprising:
  adsorbing a precursor gas onto a surface of an object to be processed,
  wherein adsorbing the precursor gas comprises:
    suppressing a phase change of the precursor gas, which is caused by a temperature drop due to adiabatic expansion, by supplying an adjustment gas according to a difference between an internal pressure of a flow rate controller and a pressure on a downstream side of the flow rate controller;
    comparing the difference between the internal pressure of the flow rate controller and the pressure on the downstream side of the flow rate controller with a first predetermined value which is set in advance;
    causing the adjustment gas to be supplied to a pipe on the downstream side of the flow rate controller when the difference is larger than the first predetermined value; and
    causing the flow rate controller to supply the precursor gas into a process chamber when the difference is equal to or less than the first predetermined value.

* * * * *